US010985713B2

(12) United States Patent
Patchin et al.

(10) Patent No.: US 10,985,713 B2
(45) Date of Patent: Apr. 20, 2021

(54) POWER AMPLIFIER WITH A TRACKING POWER SUPPLY

(71) Applicant: Apex Microtechnology, Inc., Tucson, AZ (US)

(72) Inventors: Gregory Michael Patchin, Tucson, AZ (US); Miroslav Vasic, Madrid (ES); Vladan Lazarevic, Madrid (ES); Jens Eltze, Oro Valley, AZ (US); Kirby Neil Gaulin, Tucson, AZ (US); Jesus Angel Oliver, Madrid (ES); Pedro Alou, Madrid (ES); Jose Antonio Cobos, Madrid (ES)

(73) Assignee: APEX MICROTECHNOLOGY, INC., Tucson, AZ (US)

( * ) Notice: Subject to any disclaimer, the term of this patent is extended or adjusted under 35 U.S.C. 154(b) by 28 days.

(21) Appl. No.: 16/539,733

(22) Filed: Aug. 13, 2019

(65) Prior Publication Data
US 2020/0052662 A1    Feb. 13, 2020

Related U.S. Application Data

(60) Provisional application No. 62/718,226, filed on Aug. 13, 2018.

(51) Int. Cl.
*H03F 3/04*    (2006.01)
*H03F 3/21*    (2006.01)
*H03F 1/02*    (2006.01)

(52) U.S. Cl.
CPC .............. *H03F 3/21* (2013.01); *H03F 1/0216* (2013.01); *H03F 1/0211* (2013.01); *H03F 1/0244* (2013.01); *H03F 2200/102* (2013.01); *H03F 2200/504* (2013.01)

(58) Field of Classification Search
CPC ........ H03F 3/21; H03F 1/0216; H03F 1/0244; H03F 1/0211; H03F 2200/504; H03F 1/0227; H03F 1/305; H03F 3/04; H03F 2200/507; H03G 3/004; H03G 3/3042
USPC .......................................................... 330/297
See application file for complete search history.

(56) References Cited

U.S. PATENT DOCUMENTS

| 4,079,305 | A |   | 3/1978  | Peterson et al. |         |
|-----------|---|---|---------|-----------------|---------|
| 4,423,389 | A | * | 12/1983 | Fushiki ........ | H03F 1/0244 330/297 |
| 4,443,771 | A | * | 4/1984  | Ishii .......... | H03F 1/0222 330/267 |
| 4,586,002 | A | * | 4/1986  | Carver ......... | H03F 3/3069 330/267 |
| 5,396,194 | A | * | 3/1995  | Williamson ..... | H03F 1/0233 330/202 |
| 5,818,301 | A | * | 10/1998 | Higashiyama .... | H03F 1/52 330/266 |

(Continued)

OTHER PUBLICATIONS

Gong, et al., "Design, Control and Performance of Tracking Power Supply for a Linear Power Amplifier", Power Electronics Specialists Conference, 2005. PESC '05. IEEE 36th.

(Continued)

*Primary Examiner* — Khanh V Nguyen
(74) *Attorney, Agent, or Firm* — Ballard Spahr LLP

(57) ABSTRACT

Systems and methods are described for a power amplifier with a tracking power supply. The power amplifier may use envelope tracking. The power amplifier is protected when the output of the power amplifier is short circuited or overloaded.

20 Claims, 7 Drawing Sheets

(56) References Cited

U.S. PATENT DOCUMENTS

| | | | |
|---|---|---|---|
| 5,898,340 A * | 4/1999 | Chatterjee | H03F 3/2171 |
| | | | 330/251 |
| 8,143,949 B2 * | 3/2012 | French | H03F 3/187 |
| | | | 330/263 |
| 2009/0016549 A1 | 1/2009 | French et al. | |
| 2009/0267688 A1 | 10/2009 | Hoyerby et al. | |
| 2016/0036388 A1 | 2/2016 | Xu et al. | |

OTHER PUBLICATIONS

International Search Report and Written Opinion dated Oct. 29, 2019 by the International Searching Authority for International Application No. PCT/US2019/046360, filed on Aug. 13, 2019 (Applicant—Apex Microtechnology, Inc.) (8 Pages).

* cited by examiner

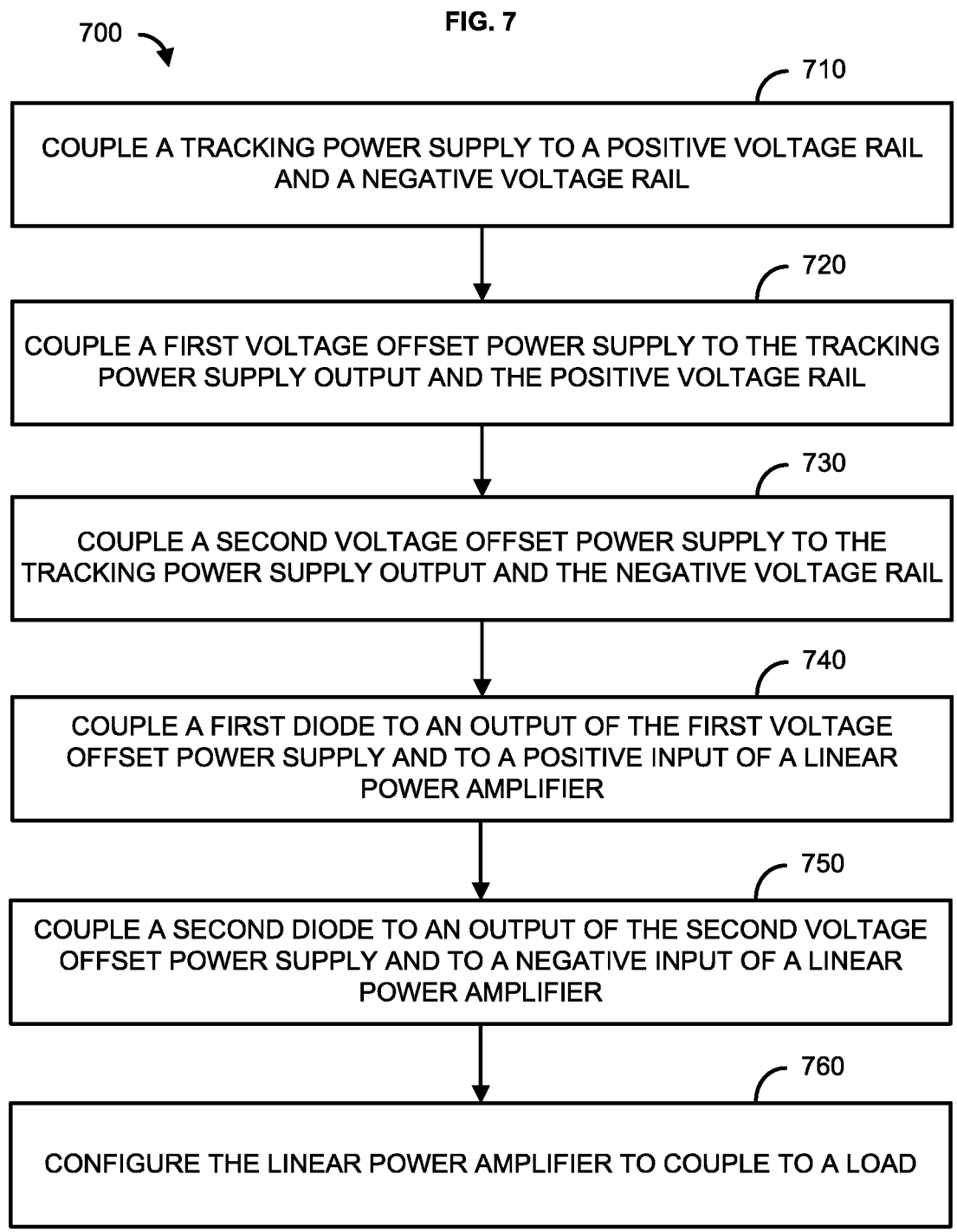

POWER AMPLIFIER WITH A TRACKING POWER SUPPLY

CROSS REFERENCE TO RELATED PATENT APPLICATION

This application claims priority to U.S. Provisional Application No. 62/718,226 filed Aug. 13, 2018, which is herein incorporated by reference in its entirety.

BACKGROUND

Power Amplifiers are devices that amplify a voltage and/or a current signal. One example of a power amplifier is a power amplifier that receives power from a Tracking Power Supply (TPS). The TPS produces a voltage that is equivalent to the output of the power amplifier plus minimum required headroom, which increase efficiency of the power amplifier. However, if the output of the power amplifier is short circuited or overloaded, the TPS will attempt to match the short circuit or overload, which may result in damage to the power amplifier or the TPS. One method of prevent damaging to the power amplifier and the TPS is to shut down the TPS. However, doing so results in down time of the power amplifier and reduces the operating range of the power amplifier. These and other shortcomings are addressed by the approaches set forth herein.

SUMMARY

It is to be understood that both the following general description and the following detailed description are exemplary and explanatory only and are not restrictive. Provided are systems, apparatuses, and methods for protecting a power amplifier when an output of the power amplifier is short circuited or overloaded.

In an exemplary embodiment, an apparatus has a tracking power supply that generates an output similar to an output of a linear power amplifier. The tracking power supply may be connected to a positive voltage rail and a negative voltage rail. The apparatus also has a voltage offset power supply connected to the tracking power supply output and the positive voltage rail. The apparatus further has another voltage offset power supply connected to the tracking power supply output and the negative voltage rail. The apparatus also has a diode connected to an output of the voltage offset power supply and connected to a positive power supply input of the linear power amplifier. Additionally, the apparatus also has another diode connected to an output of the second voltage offset voltage power supply and connected to a negative power supply input of the linear power amplifier. The output of the linear power amplifier may be connected to a load.

In another exemplary embodiment, an apparatus has a tracking power supply that generates an output similar to an output of a linear power amplifier. The tracking power supply may be connected to a positive voltage rail and a negative voltage rail. The apparatus also has a voltage offset power supply connected to the tracking power supply output and the positive voltage rail. The apparatus further has another voltage offset power supply connected to the tracking power supply output and the negative voltage rail. The apparatus also has a switch connected to an output of the voltage offset power supply and connected to a positive power supply input of the linear power amplifier. Additionally, the apparatus also has another switch connected to an output of the second voltage offset voltage power supply and connected to a negative power supply input of the linear power amplifier. The output of the linear power amplifier may be connected to a load.

In another exemplary embodiment, a method comprises connecting a tracking power supply to a positive voltage rail and a negative voltage rail. The tracking power supply may generate an output similar to a linear power amplifier output. The method also comprises connecting a first voltage offset power supply to the tracking power supply output and the positive voltage rail. The method further comprises connecting a second voltage offset power supply to the tracking power supply output and the negative voltage rail. Additionally, the method comprises connecting a diode to an output of the first voltage offset power supply and to a positive power supply input of the linear power amplifier. The method also comprises connecting another diode to an output of the second voltage offset voltage power supply and to a negative power supply input of the linear power amplifier. The method also comprises connecting an output of the linear power amplifier to a load.

Additional advantages will be set forth in part in the description which follows or can be learned by practice. The advantages will be realized and attained by means of the elements and combinations particularly pointed out in the appended claims.

BRIEF DESCRIPTION OF THE DRAWINGS

The accompanying drawings, which are incorporated in and constitute a part of this specification, show examples and together with the description, serve to explain the principles of the methods and systems:

FIG. 7 is a flowchart of an exemplary method.

DETAILED DESCRIPTION

Figure 1:
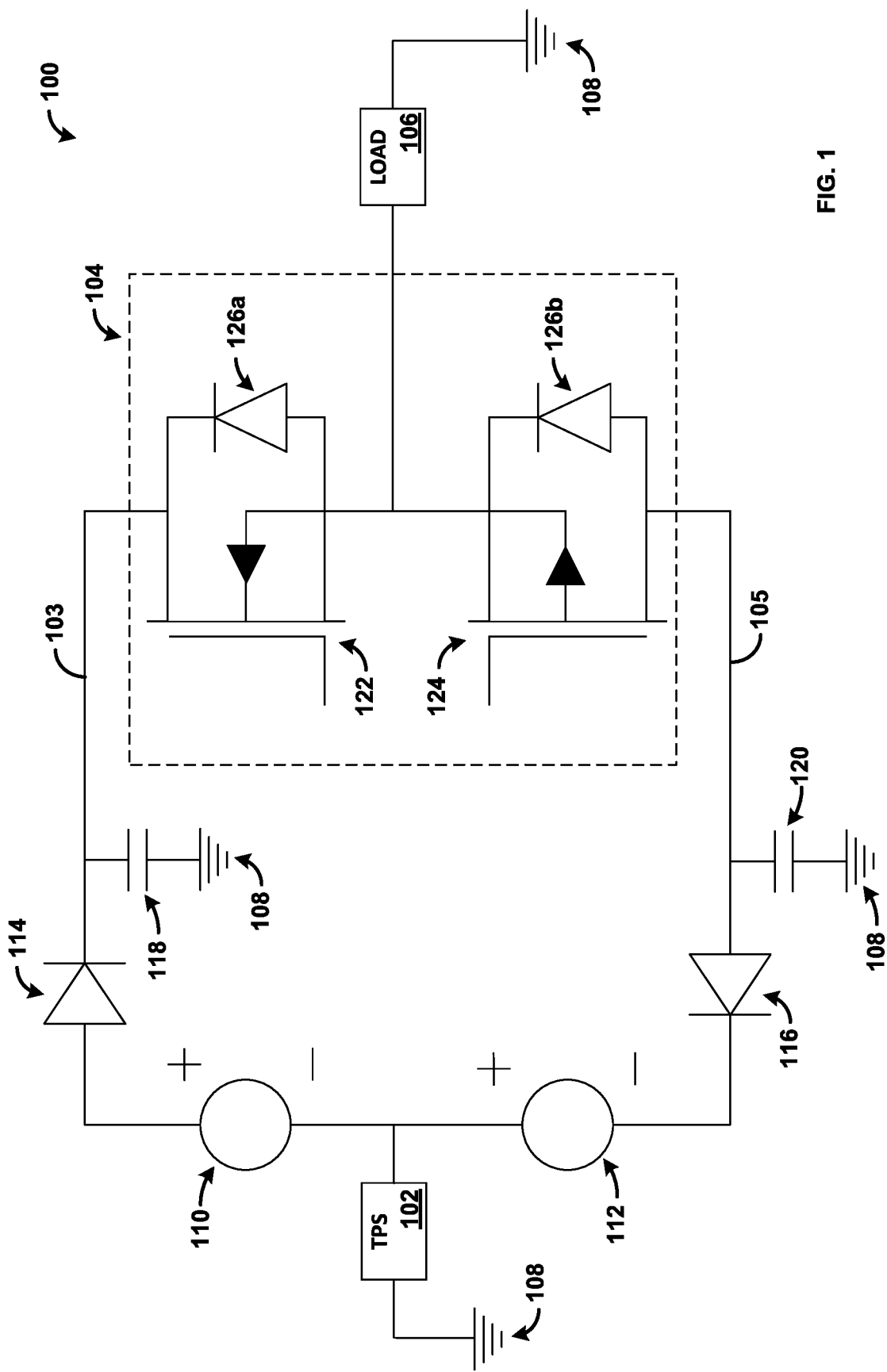
FIG. 1 is an example of an apparatus.

Before the present methods and systems are disclosed and described, it is to be understood that the methods and systems are not limited to specific methods, specific components, or to particular implementations. It is also to be understood that the terminology used herein is for the purpose of describing particular examples only and is not intended to be limiting.

As used in the specification and the appended claims, the singular forms "a," "an," and "the" include plural referents unless the context clearly dictates otherwise. Ranges may be expressed herein as from "about" one particular value, and/or to "about" another particular value. When such a range is expressed, another example includes from the one particular value and/or to the other particular value. Similarly, when values are expressed as approximations, by use of the antecedent "about," it will be understood that the particular value forms another example. It will be further understood that the endpoints of each of the ranges are significant both in relation to the other endpoint, and independently of the other endpoint.

"Optional" or "optionally" means that the subsequently described event or circumstance may or may not occur, and that the description includes examples where said event or circumstance occurs and examples where it does not.

Throughout the description and claims of this specification, the word "comprise" and variations of the word, such as "comprising" and "comprises," means "including but not limited to," and is not intended to exclude, for example, other components, integers or steps. "Exemplary" means "an example of" and is not intended to convey an indication of a preferred or ideal example. "Such as" is not used in a restrictive sense, but for explanatory purposes.

Described herein are components that may be used to perform the described methods and systems. These and other components are described herein, and it is understood that when combinations, subsets, interactions, groups, etc. of these components are described that while specific reference of each various individual and collective combinations and permutation of these may not be explicitly described, each is specifically contemplated and described herein, for all methods and systems. This applies to all examples of this application including, but not limited to, steps in described methods. Thus, if there are a variety of additional steps that may be performed it is understood that each of these additional steps may be performed with any specific example or combination of examples of the described methods.

The present methods and systems may be understood more readily by reference to the following description of preferred examples and the examples included therein and to the Figures and their previous and following description.

The methods and systems are described below with reference to block diagrams and flowcharts of methods, systems, apparatuses and computer program products. It will be understood that each block of the block diagrams and flowcharts, and combinations of blocks in the block diagrams and flowcharts, respectively, may be implemented by computer program instructions. These computer program instructions may be loaded onto a general purpose computer, special purpose computer, or other programmable data processing apparatus to produce a machine, such that the instructions which execute on the computer or other programmable data processing apparatus create a means for implementing the functions specified in the flowchart block or blocks.

These computer program instructions may also be stored in a computer-readable memory that may direct a computer or other programmable data processing apparatus to function in a particular manner, such that the instructions stored in the computer-readable memory produce an article of manufacture including computer-readable instructions for implementing the function specified in the flowchart block or blocks. The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide steps for implementing the functions specified in the flowchart block or blocks.

Accordingly, blocks of the block diagrams and flowcharts support combinations of means for performing the specified functions, combinations of steps for performing the specified functions and program instruction means for performing the specified functions. It will also be understood that each block of the block diagrams and flowcharts, and combinations of blocks in the block diagrams and flowcharts, may be implemented by special purpose hardware-based computer systems that perform the specified functions or steps, or combinations of special purpose hardware and computer instructions.

In an aspect, a circuit that protects the amplifier during a short circuit comprises a linear power amplifier connected to a load, supplied by two voltage rails, positive $V_+$ and negative $V_-$, and that generates a demanded output voltage. The circuit also has a converter that generates a variable supply voltage equal to the power amplifier's output voltage (e.g., a Tracking Power Supply (TPS)), $V_{TPS}$. The circuit has two constant voltage sources of equal voltage, $\Delta V_{offset}$, combined in series with the TPS to obtain $V_{TPS}+\Delta V_{offset}$ and $V_{TPS}-\Delta V_{offset}$. The circuit also has one diode placed to conduct current from $V_{TPS}+\Delta V_{offset}$ to $V_+$. The circuit has another diode placed to conduct current from $V_-$ to $V_{TPS}-\Delta V_{offset}$. The circuit may have two decoupling capacitors placed between $V_+$ and ground, as well as $V_-$ and ground.

In an aspect, a circuit that protects the amplifier during a short circuit comprises a linear power amplifier connected to a load, supplied by two voltage rails, positive $V_+$ and $V_-$, and that generates a demanded output voltage. The circuit also has a converter that generates a variable supply voltage equal to the power amplifier's output voltage (e.g., a Tracking Power Supply (TPS)), $V_{TPS}$. The circuit has two constant voltage sources of equal voltage, $\Delta V_{offset}$, combined in series with the TPS to obtain $V_{TPS}+\Delta V_{offset}$ and $V_{TPS}-\Delta V_{offset}$. The circuit also has one switch placed between $V_{TPS}+\Delta V_{offset}$ and $V_+$. The circuit has another switch placed between $V_-$ and $V_{TPS}-\Delta V_{offset}$. The circuit may have two decoupling capacitors placed between $V_+$ and ground, as well as $V_-$ and ground. The circuit may also have a control circuit that generates control signals for the switches based on the load current.

FIG. 1 illustrates an example of an apparatus 100. In an aspect, the apparatus 100 protects a power amplifier 104 and/or a Tracking Power Supply (TPS) 102 in the event of short circuits and/or overloads. As shown, the apparatus 100 has the TPS 102, the power amplifier 104, and a load 106. The TPS 102 is connected with a ground connection 108, as well as first offset power supply 110 and a second offset power supply 112. The TPS 102 may be connected in series with the offset power supplies 110, 112. The TPS 102 can be coupled and/or connected with a positive voltage rail 103 of the amplifier 104 via the first offset power supply 110 and a diode 114. Further, the TPS 102 can be coupled and/or connected to a negative voltage rail via 105 of the amplifier 104 via the second offset power supply 112 and a diode 116. In an aspect, the offset power supplies 110, 112 are constant voltage power supplies that increase or decrease the output of the TPS 102 a set amount. For example, the first offset power supply 110 increases the output of the TPS 102 on the positive rail by a positive voltage amount (e.g., +1V, +5V, +25V, etc.). Stated differently, the first offset power supply 110 adds power to the output of the TPS 102 on the positive voltage rail 103. As another example, the second offset power supply 112 increases the negative output of the TPS 102 on the negative rail 105 by a negative voltage amount (e.g., −1V, −5V, −25V, etc.). Stated differently, the second offset power supply 112 adds power from the output of the TPS 102 on the negative voltage rail 105.

As shown, the first offset power supply 110 is connected and/or coupled with the diode 114. The first offset power supply 110 can be connected in series with the anode of the diode 114. The cathode of the diode 114 can be coupled and/or connected with a capacitor 118. In an aspect, the capacitor 118 is a bypass capacitor. The capacitor 118 can be connected in series with the ground 118. The capacitor 118 can have any reasonable capacitance. The capacitance of the capacitor 118 can depend on the size of the TPS 102 and/or the amplifier 104. As shown, the cathode of the diode 114 is connected in series with the positive power supply input (e.g., the positive rail 103) of the power amplifier 104.

As shown, the second offset power supply 112 is connected and/or coupled with a diode 116. The second offset power supply 112 can be connected in series with the cathode of the diode 116. The anode of the diode 116 can be coupled and/or connected with a capacitor 120. In an aspect, the capacitor 120 is a bypass capacitor. The capacitor 120 can be connected in series with the ground 120. The capacitor 120 can have any reasonable capacitance. The capacitance of the capacitor 120 can depend on the size of the TPS 102 and/or the amplifier 104. As shown, the anode of the diode 116 is connected in series with the negative power supply input (e.g., the negative rail 105) of the power amplifier 104.

As shown, the power amplifier 104 comprises a first transistor 122 and a second transistor 124. In an aspect, the power amplifier 104 is a linear power amplifier. The transistors 122, 124 are connected in parallel with a respective diode 126. Specifically, the transistor 122 has a respective diode 126a, and the transistor 124 has a respective diode 126b. The transistors 122, 124 can be stage transistors of the power amplifier 104. For example, the transistors 122, 124 can be opposite stage transistors such that one of the transistors 122, 124 is not producing power, while the other transistor is producing power. Thus, the transistors 122, 124 can each produce power in one power stage for the amplifier 104. The power amplifier 104 is connected in series with a load 106. The load 106 can be coupled with the ground 108. While not shown for ease of explanation, a person skilled in the art would appreciate that there can be currents, voltages, and impedances associated with each of the parts of the apparatus 100. For example, the load 106 can have a load current, a load voltage, and a load impedance.

In an aspect, the TPS 102 will produce a voltage equal to the power amplifier's 104 output voltage. In an aspect, the TPS 102 will only supply power to the power amplifier's 104 transistor (e.g., the transistors 122, 124) that is active. For example, when the load 106 current is positive, the transistor 122 will be active; and when the load 106 current is negative, the transistor 124 will be active. During a short circuit, the diodes 114, 116 prevent any current flow in the same direction on both the positive rail 103 and the negative rail 105. By allowing current to only flow in on direction, only one of the transistors 122, 124 will be conducting current during in a short circuit situation or a current limited mode.

In an aspect, when the load 106 current switches from a positive value to a negative value, the transistor 122 will stop conducting, and the diode 114 will turn off. Further, when the diode 114 and the transistor 122 are turned off, the capacitor 118 will effectively be disconnected from the diode 114 and the transistor 122. In an aspect, the capacitor 118 will stay charged to the value of $V_{s+}=V_{load}+\Delta V_{offset}$ (as $V_{TPS}=V_{load}$) that the positive supply rail had in the moment when the load 106 current reached zero. Further, as the load 106 current transitions from positive to negative, the diode 114 and the capacitor 118 can act as peak detector of $V_{load}+\Delta V_{offset}$ voltage. As the load 106 current becomes negative, current will begin to flow through the transistor 124 and the diode 116.

In an aspect, the diode 114 prevents a short circuit from occurring when the current being supplied to the load 106 switches from a positive value to a negative value. For example, when the load 106 current switches from a positive value to a negative value, the current through the diode 114 will cease. Further, due to the physical capabilities of the diode 114, as will be appreciated by one skilled in the art, the diode 114 prevents any negative current from traveling through the diode 114 and reaching the TPS 102. Thus, the diode 114 prevents any damage occurring to the TPS 102 and the power amplifier 104 by prevent a negative current from flowing from the power amplifier 104 to the TPS 102 via the positive voltage rail 103.

In an aspect, when the load 106 current switches from a negative value to a positive value, the transistor 124 will stop conducting, and the diode 116 will turn off. Further, the capacitor 120 will effectively be disconnected from the diode 116 and the transistor 124 when the diode 116 and the transistor 124 are turned off. In an aspect, the capacitor 120 will stay charged to the value of $V_{s-}=V_{load}+\Delta V_{offset}$ (as $V_{TPS}=V_{load}$) that the negative supply rail had in the moment when the load 106 current reached zero. Further, as the load 106 current transitions from negative to positive, the diode 116 and the capacitor 120 can act as peak detector of $V_{load}+\Delta V_{offset}$ voltage. As the load 106 current becomes positive, current will begin to flow through the transistor 122 and the diode 114.

In an aspect, the diode 116 prevents a short circuit from occurring when the current being supplied to the load 106 switches from a negative value to a positive value. For example, when the load 106 current switches from a negative value to a positive value, the current through the diode 116 will cease. Further, due to the physical capabilities of the diode 116, as will be appreciated by one skilled in the art, the diode 116 prevents any positive current from traveling through the diode 116 and reaching the power amplifier 104. Thus, the diode 116 prevents any damage occurring to the TPS 102 and the power amplifier 104 by preventing a positive current from flowing from the TPS 102 to the power amplifier 104 via the negative voltage rail 105.

Figure 2:
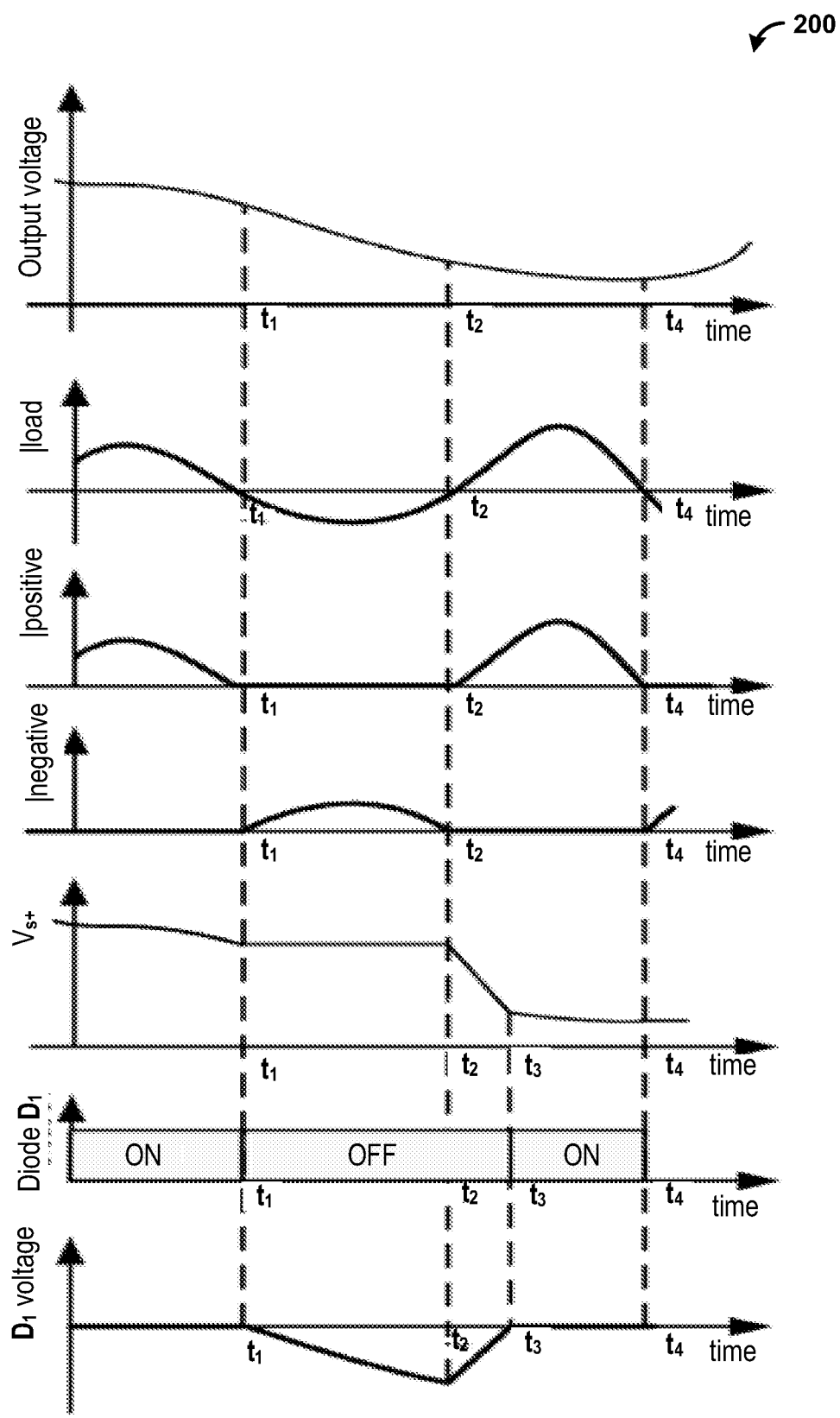
FIG. 2 is an example diagram of voltage and current waveforms.

FIG. 2 illustrates an example diagram 200 of voltage and current waveforms. Specifically, the voltage and current waveform 200 illustrate how the diode 114 is turned off and on under the scenario when the load 106 voltage is monotonically decreased between the moments when the transistor 122 conducts (e.g., there is a positive load 106 current). For ease of explanation, the $\Delta V_{offset}$ is equal to zero, but a person skilled in the art would appreciate that the $\Delta V_{offset}$ can be any value. As shown, the transistor 122 and the diode 114 conduct the load 106 current until the time $t_1$. At the time $t_1$, the load 106 current goes from a positive value to a negative value. Thus, at the time $t_1$, the diode 114 is turned off and the capacitor 118 will stay charged with voltage equal to $(V_{load}+\Delta V_{offset})(t_1)$. The capacitor 118 will stay charged until a time $t_2$ when the load 106 current becomes positive. In an aspect, because $(V_{load}+\Delta V_{offset})(t_1)$ is higher than $V_{load}(t_2)$, the diode 114 stays turned off, and the load 106 current discharges the capacitor 118 until a time $t_3$, when the load voltage is equal to $(V_{load}+\Delta V_{offset})(t_1)$, the diode 114 starts conducting once again. When this happens, the TPS 102 begins to provide the load 106 current and modulate the positive supply rail. While FIG. 2 is described with reference to the diode 114, the capacitor 118, and the transistor 122 for ease of explanation, a person skilled in the art would appreciate that the diode 116, the capacitor 120, and the transistor 124 operate in a similar manner but with the polarity of the voltages and current switched.

Figure 3:
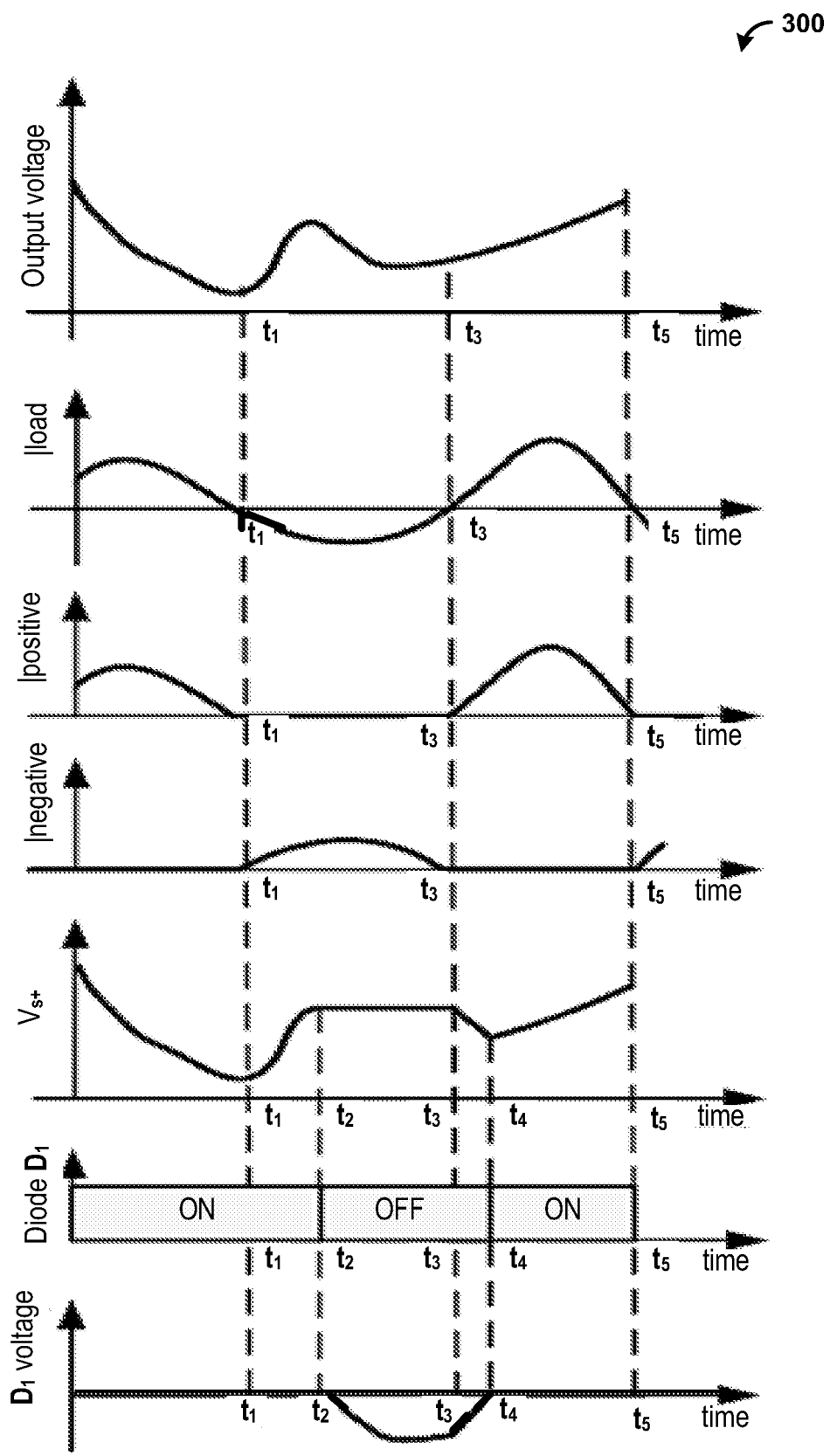
FIG. 3 is an example diagram of voltage and current waveforms.

FIG. 3 illustrates an example diagram 300 of voltage and current waveforms. Specifically, the diagram 300 illustrates how the diode 114 is turned off and on when the load 106 voltage is changing dynamically between the moments when the transistor 122 conducts (e.g., there is a positive load 106 current). As shown, the transistor 122 will conduct until a time ($t_1$). At the time ($t_1$), the transistor 122 turns off, but the diode 114 continues to run. Also, at the time ($t_1$), the transistor 124 and the diode 116 turn on. From the time ($t_1$) until the time ($t_2$), as $V_{load}$ and $V_{load}+\Delta V_{offset}$ increase, the diode 114 will conduct charging of the capacitor 118. From the time ($t_2$) until the time ($t_3$), $V_{load}+\Delta V_{offset}$ does not reach a value higher than $(V_{load}+\Delta V_{offset})(t_2)$ and $V_{s+}$ is not changed. Thus, from the time ($t_2$) until the time ($t_3$), the diode 114 does not conduct. At the time ($t_4$), the transistor 122 begins to conduct again, and the diode 114 begins to conduct as well. While FIG. 3 is described with reference to the diode 114, the capacitor 118, and the transistor 122 for ease of explanation, a person skilled in the art would appreciate that the diode 116, the capacitor 120, and the transistor 124 operate in a similar manner but with the polarity of the voltages and current switched.

Figure 4:
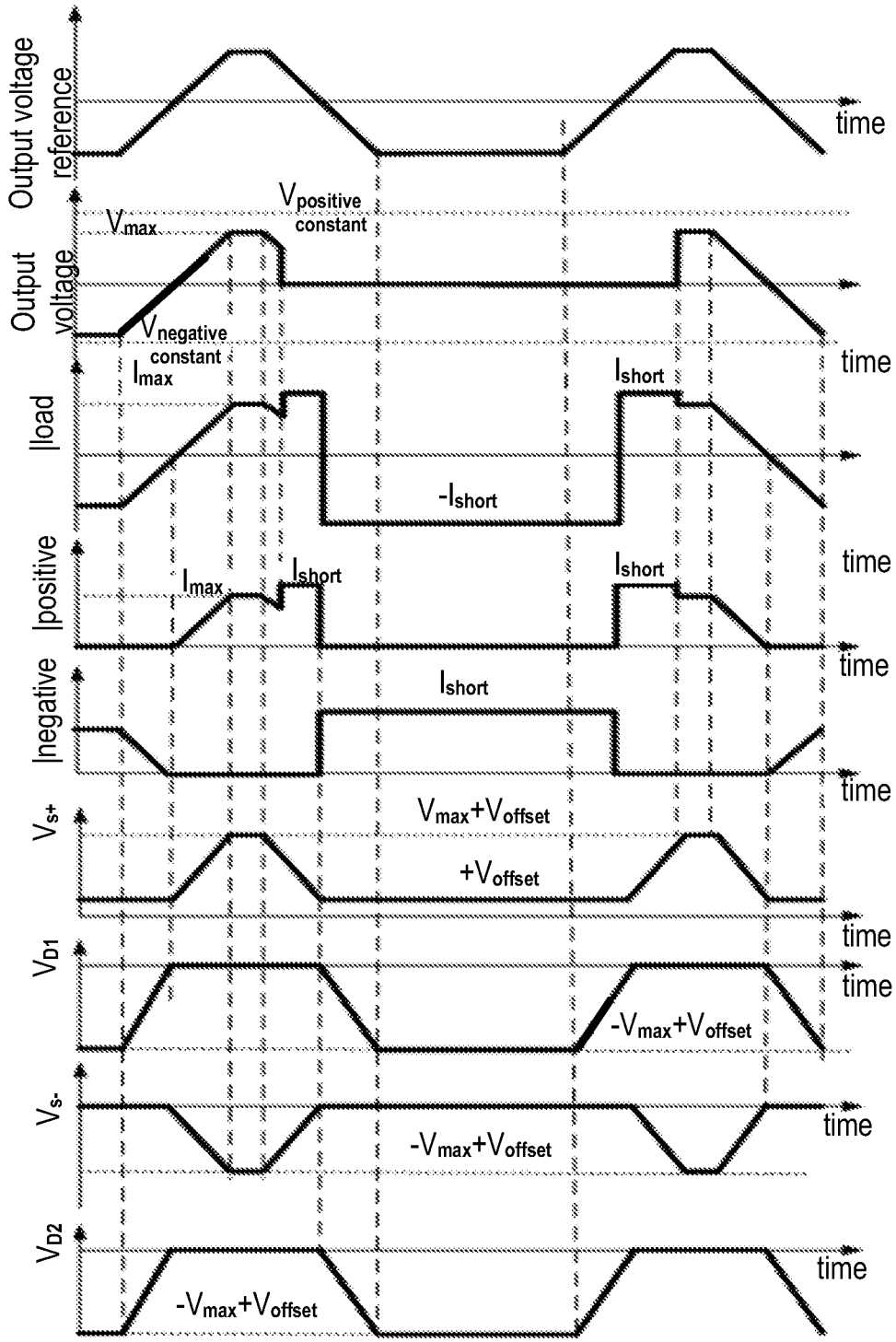
FIG. 4 is an example diagram of voltage and current waveforms.

FIG. 4 illustrates an example diagram 400 of voltage and current waveforms. Specifically, the diagram 400 illustrates how the diodes 114 and 116 are turned on and off in the case when a short circuit is produced when the power amplifier drives a resistive load. The short circuit occurs at ($t_1$) and the short circuit current is conducted via diode 114 until the moment ($t_2$) when the load current changes direction due to the power amplifier reference. From ($t_2$) until ($t_4$), the short circuit current goes through diode 116. At ($t_4$), the power amplifier reference changes signs from negative to positive, and the load current changes to positive. The diode 114 then conducts the short circuit current once again. At ($t_5$), the short circuit is cleared, and the diode 114 conducts the load current that is proportional to the output voltage (e.g., the resistive load). Additional waveforms, such as blocking voltages, are shown for the sake of better understanding.

Figure 5:
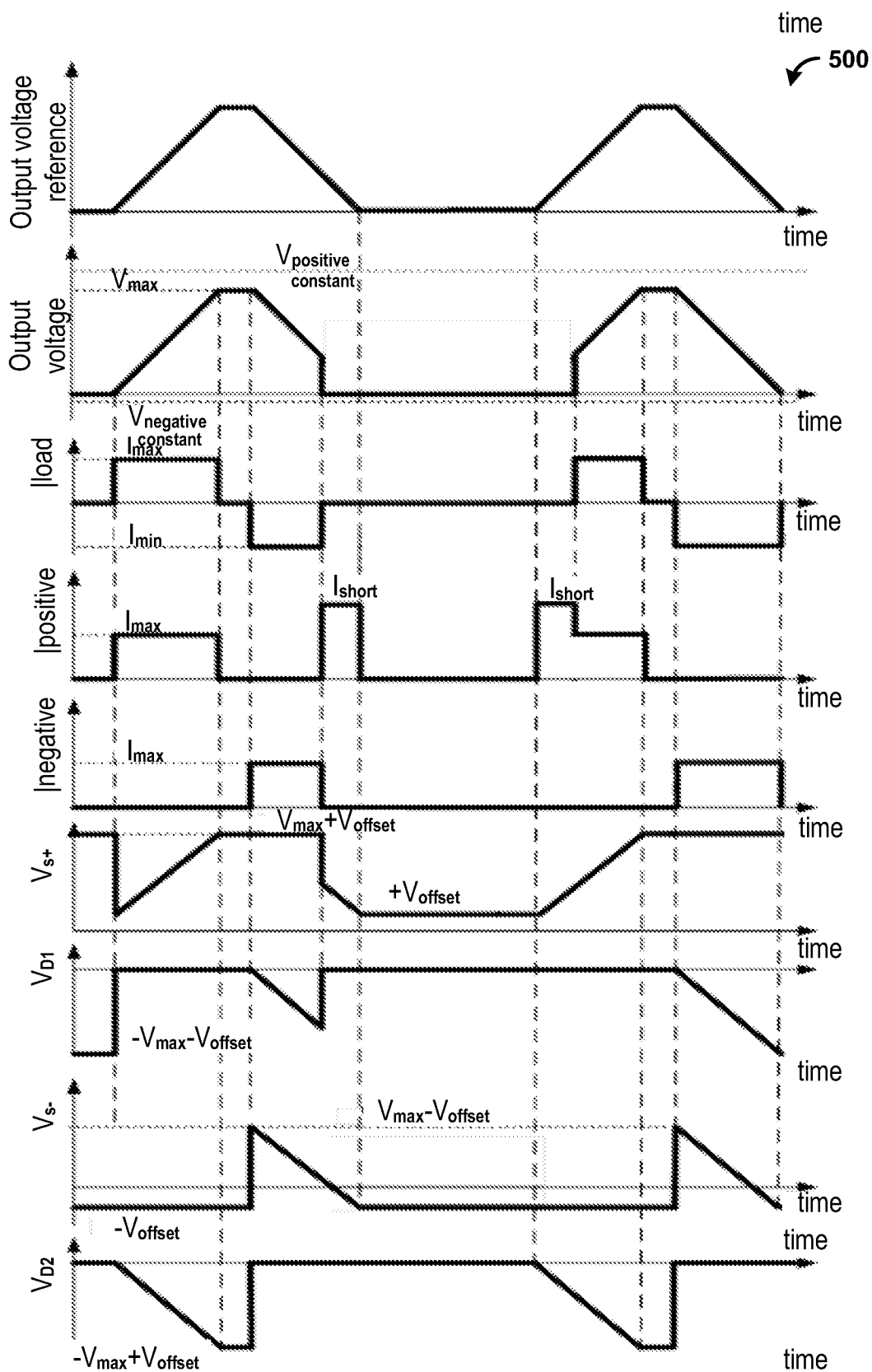
FIG. 5 is an example diagram of voltage and current waveforms.
Figure 6:
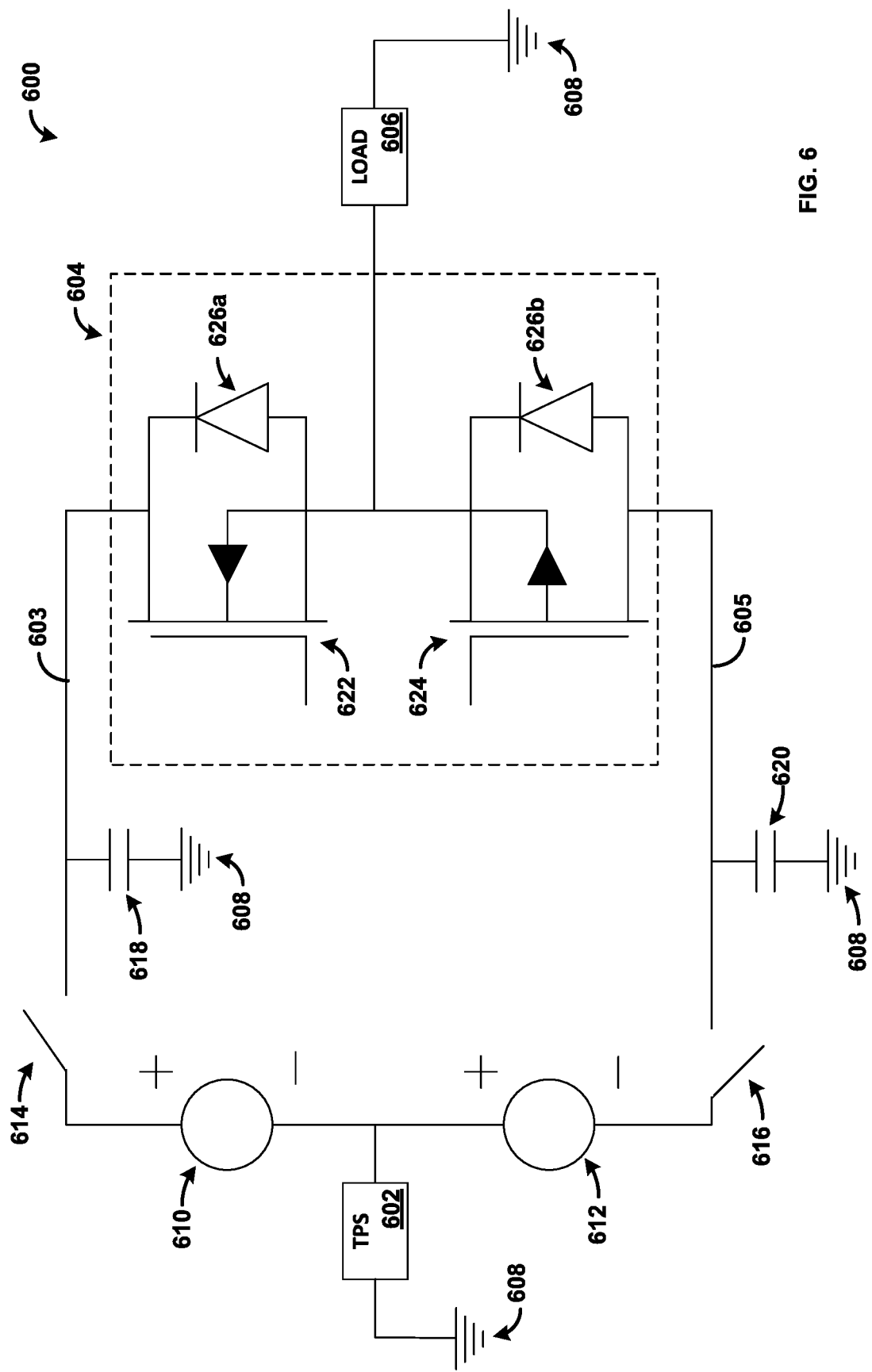
FIG. 6 is an example of an apparatus.

FIG. 5 illustrates an example diagram 500 of voltage and current waveforms. Specifically, the diagram 500 illustrates how the diodes 114 and 116 are turned on and off in the case when a short circuit is produced when the power amplifier drives a capacitive load. The short circuit occurs at ($t_1$) and the short circuit current is conducted through the diode 114, until the moment ($t_2$) when the power amplifier voltage reference reaches zero. At ($t_3$), the power amplifier voltage reference becomes positive once again and the short circuit current is conducted by diode the 114. At ($t_4$), the short circuit is cleared and the apparatus starts operating in the normal mode. Additional waveforms such as blocking voltages are shown for the sake of better understanding FIG. 6 is an example of an apparatus 600. In an aspect, the apparatus 600 protects a power amplifier 604 and/or a Tracking Power Supply (TPS) 602 in the event of short circuits and/or overloads. As shown, the apparatus 600 has the TPS 602, the power amplifier 604, and a load 606. The TPS 602 is connected with a ground connection 608, as well as first offset power supply 610 and a second offset power supply 612. The TPS 602 may be connected in series with the offset power supplies 610, 612. The TPS 602 can be coupled and/or connected with the first offset power supply 610 via a positive voltage rail 603. Further, the TPS 602 can be coupled and/or connected to the second offset power supply 612 via a negative voltage rail 605. In an aspect, the offset power supplies 610, 612 are constant voltage power supplies that increase or decrease the output of the TPS 602 a set amount. For example, the first offset power supply 610 increases the output of the TPS 602 on the positive rail 603 by a positive voltage amount (e.g., +1V, +5V, +25V, etc.).

Stated differently, the first offset power supply 610 adds power to the output of the TPS 602 on the positive voltage rail 603. As another example, the second offset power supply 612 increases the negative output of the TPS 602 on the negative rail 605 by a negative voltage amount (e.g., −1V, −5V, −25V, etc.). Stated differently, the second offset power supply 612 adds power from the output of the TPS 602 on the negative voltage rail 605.

As shown, the first offset power supply 610 is connected and/or coupled with a switch 614. The first offset power supply 610 can be connected in series with the switch 614. The switch 614 can be coupled and/or connected with a capacitor 618. In an aspect, the capacitor 618 is a decoupling capacitor. The capacitor 618 can be connected in series with the ground 608. The capacitor 618 can have any reasonable capacitance. The capacitance of the capacitor 618 can depend on the size of the TPS 602 and/or the amplifier 604. As shown, the switch 614 is connected in series with the positive power supply input (e.g., the positive rail) of the power amplifier 604.

As shown, the second offset power supply 612 is connected and/or coupled with a switch 616. The second offset power supply 612 can be connected in series with the switch 616. The switch 616 can be coupled and/or connected with a capacitor 620. In an aspect, the capacitor 620 is a decoupling capacitor. The capacitor 620 can be connected in series with the ground 608. The capacitor 620 can be connected in series with the ground 608. The capacitor 620 can have any reasonable capacitance. The capacitance of the capacitor 620 can depend on the size of the TPS 602 and/or the amplifier 604. As shown, the switch 616 is connected in series with the negative power supply input (e.g., the negative rail) of the power amplifier 604.

As shown, the power amplifier 604 comprises a first transistor 622 and a second transistor 624. In an aspect, the power amplifier 604 is a linear power amplifier. The transistors 622, 624 are connected in parallel with a respective diode 626. Specifically, the transistor 622 has a respective diode 626a, and the transistor 624 has a respective diode 626b. The transistors 622, 624 can be stage transistors of the power amplifier 604. For example, the transistors 622, 624 can be opposite stage transistors such that one of the transistors 622, 624 is not producing power, while the other transistor is producing power. Thus, the transistors 622, 624 can each produce power in one power stage for the amplifier 604. The power amplifier 604 is connected in series with a load 606. The load 606 can be coupled with the ground 608. While not shown for ease of explanation, a person skilled in the art would appreciate that there can be currents, voltages, and impedances associated with each of the parts of the apparatus 600. For example, the load 606 can have a load current, a load voltage, and a load impedance.

In an aspect, the TPS 602 will produce a voltage equal to the power amplifier's 604 output voltage. In an aspect, the TPS 602 will only supply power to the power amplifier's 604 stage transistor that is active. For example, when the load 606 current is positive, the transistor 622 will be active; and when the load 606 current is negative, the transistor 624 will be active. During a short circuit, the switches 614, 616 prevent any current flow in the same direction on both the positive rail 603 and the negative rail 605. By allowing current to only flow in on direction, only one of the transistors 622, 624 will be conducting current even in a short circuit situation or a current limited mode.

In an aspect, the switches 614, 616 are controllable switches. For example, the control signal for the switches is generated from the sign of the load 606 current. In an aspect, the control logic for the switches 614, 616 comprises a load current measurement and a set of comparators. As an example, when the load 606 current is positive, the switch 614 is closed and the transistor 622 is conducting. When the current is positive, the switch 616 is open and the transistor 624 is not conducting. As another example, when the load 606 current is positive, the switch 616 is closed and the transistor 624 is conducting. When the current is negative, the switch 614 is open and the transistor 622 is not conducting. In this manner, the switches 614, 616 prevent conduction of current through the diodes 626 during a short circuit event similar to the diodes 114, 116 of FIG. 1.

In an aspect, when the load 606 current switches from a positive value to a negative value, the transistor 622 will stop conducting electricity, and the switch 614 will open preventing any current from flowing through the switch 614. Further, when the switch 614 is open and the transistor 622 is turned off, the capacitor 618 will effectively be disconnected from the switch 614 and the transistor 622. As the load 606 current becomes negative, current will begin to flow through the transistor 624 and the switch 616.

In an aspect, the switch 614 prevents a short circuit from occurring when the current being supplied to the load 606 switches from a positive value to a negative value. For example, when the load 606 current switches from a positive value to a negative value, the switch 614 opens and current will cease to flow through the switch 614. Thus, the switch 614 prevents any negative current from traveling through the switch 614 and reaching the TPS 602. Thus, the switch 614 prevents any damage occurring to the TPS 602 and the power amplifier 604 by prevent a negative current from flowing from the power amplifier 604 to the TPS 602 via the positive voltage rail 603.

In an aspect, when the load 606 current switches from a negative value to a positive value, the transistor 624 will stop conducting electricity, and the switch 616 will open preventing any current from flowing through the switch 616. Further, the capacitor 620 will effectively be disconnected from the switch 614 and the transistor 622 when the switch 616 is open and the transistor 624 is turned off. As the load 606 current becomes positive, current will begin to flow through the transistor 622 and the switch 614.

In an aspect, the switch 616 prevents a short circuit from occurring when the current being supplied to the load 606 switches from a negative value to a positive value. For example, when the load 606 current switches from a negative value to a positive value, the switch 616 opens and current will cease to flow through the switch 616. Thus, the switch 616 prevents any negative current from traveling through the switch 616 and reaching the TPS 602. Thus, the switch 616 prevents any damage occurring to the TPS 602 and the power amplifier 604 by prevent a positive current from flowing from the power amplifier 604 to the TPS 602 via the negative voltage rail 605.

FIG. 7 is a flowchart of an exemplary method 700. At 710, a tracking power supply (e.g., the TPS 102, 602) is coupled to a positive voltage rail and a negative voltage rail. The tracking power supply can be configured to generate a tracking power supply output similar to a linear power amplifier output.

At 720, a first voltage offset power supply (e.g., the offset voltage power supplies 110, 112, 610, 610) is coupled to the tracking power supply and the positive voltage rail. The first voltage offset power supply can be connected in series with the tracking power supply output. The first voltage offset power supply can comprise a constant voltage source. The first voltage offset power supply can have an output similar to the second voltage offset power supply.

At 730, a second voltage offset power supply (e.g., the offset voltage power supplies 110, 112, 610, 610) is coupled to the tracking power supply and the negative voltage rail. The second voltage offset power supply can be connected in series with the tracking power supply output. The second voltage offset power supply can comprise a constant voltage source. The second voltage offset power supply can have an output similar to the second voltage offset power supply.

At 740, a first diode (e.g., the diodes 114, 116) is coupled to an output of the first voltage offset power supply and to a positive power supply input of a linear power amplifier (e.g., the power amplifiers 104, 604). In an aspect, the diode is configured to prevent a short circuit or an overload event in the tracking power supply, the power amplifier, or both. The first diode can be configured to conduct current from the output of the first voltage offset power supply to the positive power supply input of the linear power amplifier.

Additionally, the first diode can be replaced with a switch (e.g., the switches 614, 616). For example, the first switch can be coupled to an output of the first voltage offset power supply and coupled to a positive power supply input of the linear power amplifier. The first switch can be configured to be closed when the load current is positive to conduct current from the output of the first voltage offset power supply to the positive power supply input of the linear power amplifier.

At 750, a second diode (e.g., the diodes 114, 116) is coupled to an output of the second voltage offset power supply and to a negative power supply input of the linear power amplifier (e.g., the power amplifiers 104, 604). In an aspect, the diode is configured to prevent a short circuit or an overload event in the tracking power supply, the power amplifier, or both. The second diode can be configured to conduct current from the negative power supply input of the linear power amplifier to the output of the second voltage offset voltage power supply. The second switch is configured to be closed when the load current is negative to conduct current from the negative power supply input of the linear power amplifier to the output of the second voltage offset voltage power supply.

Additionally, the second diode can be replaced with a switch (e.g., the switches 614, 616). For example, the second switch can be coupled to an output of the second voltage offset voltage power supply and coupled to a negative power supply input of the linear power amplifier.

At 760, the linear power amplifier is configured to couple to a load (e.g., the load 106, 606). Additionally, a first decoupling capacitor can be coupled between the positive voltage rail and ground, and a second decoupling capacitor can be. coupled between the negative voltage rail and the ground. The first decoupling capacitor can be coupled between the first diode and the positive power supply input of the linear power amplifier. The second decoupling capacitor can be coupled between the second diode and the negative power supply input of the linear power amplifier.

While the methods and systems have been described in connection with specific examples, it is not intended that the scope be limited to the particular examples set forth, as the examples herein are intended in all respects to be possible examples rather than restrictive.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is in no way intended that an order be inferred, in any respect. This holds for any possible non-express basis for interpretation, including: matters of logic with respect to arrangement of steps or operational flow; plain meaning derived from grammatical organization or punctuation; the number or type of examples described in the specification.

It will be apparent to those skilled in the art that various modifications and variations may be made without departing from the scope or spirit. Other examples will be apparent to those skilled in the art from consideration of the specification and practice described herein. It is intended that the specification and examples be considered as exemplary only, with a true scope and spirit being indicated by the following claims.

EXEMPLARY EMBODIMENTS

Embodiment 1

An apparatus, comprising: a tracking power supply configured to generate a tracking power supply output similar to a linear power amplifier output, wherein the tracking power supply is coupled to a positive voltage rail and a negative voltage rail. A first voltage offset power supply can be coupled to the tracking power supply output and the positive voltage rail. A second voltage offset power supply can be coupled to the tracking power supply output and the negative voltage rail. A first diode can be coupled to an output of the first voltage offset power supply and coupled to a positive power supply input of the linear power amplifier. A second diode can be coupled to an output of the second voltage offset voltage power supply and coupled to a negative power supply input of the linear power amplifier. An output of the linear power amplifier coupled to a load.

Embodiment 2

The embodiment of embodiment 1, wherein the tracking power supply is configured to generate the tracking power supply output that tracks and/or follows the linear power amplifier output.

Embodiment 3

The embodiment of embodiment 1 or embodiment 2, wherein the tracking power supply output tracks and/or follows the linear power amplifier output.

Embodiment 4

The embodiment of one of the embodiments 1-3, wherein the first diode is configured to conduct current from the output of the first voltage offset power supply to the positive power supply input of the linear power amplifier.

Embodiment 5

The embodiment of one of the embodiments 1-4, wherein the second diode is configured to conduct current from the negative power supply input of the linear power amplifier to the output of the second voltage offset voltage power supply.

Embodiment 6

The embodiment of one of the embodiments 1-5, wherein the first voltage offset power supply and the second voltage offset power supply are connected in series with the tracking power supply output.

Embodiment 7

The embodiment of one of the embodiments 1-6, wherein the first voltage offset power supply and the second voltage offset power supply are constant voltage sources having similar outputs.

Embodiment 8

The embodiment of one of the embodiments 1-7, further comprising a first decoupling capacitor coupled between the positive voltage rail and ground, and a second decoupling capacitor coupled between the negative voltage rail and the ground.

Embodiment 9

The embodiment of embodiment 8, wherein the first decoupling capacitor is coupled between the first diode and the positive power supply input of the linear power amplifier.

Embodiment 10

The embodiment of one of the embodiments 8-9, wherein the second decoupling capacitor is coupled between the second diode and the negative power supply input of the linear power amplifier.

Embodiment 11

An apparatus, comprising: a tracking power supply that generates a tracking power supply output similar to a linear power amplifier output. The tracking power supply can be coupled to a positive voltage rail and a negative voltage rail. A first voltage offset power supply can be coupled to the tracking power supply output and the positive voltage rail. A second voltage offset power supply can be coupled to the tracking power supply output and the negative voltage rail. A first switch can be coupled to an output of the first voltage offset power supply and coupled to a positive power supply input of the linear power amplifier. A second switch can be coupled to an output of the second voltage offset voltage power supply and coupled to a negative power supply input of the linear power amplifier. An output of the linear power amplifier can be coupled to a load having a load current.

Embodiment 12

The embodiment of embodiment 11, wherein the tracking power supply is configured to generate the tracking power supply output that tracks and/or follows the linear power amplifier output.

Embodiment 13

The embodiment of embodiment 11 or embodiment 12, wherein the tracking power supply output tracks and/or follows the linear power amplifier output.

Embodiment 14

The embodiment of one of the embodiments 11-13, wherein the first switch is configured to be closed when the load current is positive to conduct current from the output of the first voltage offset power supply to the positive power supply input of the linear power amplifier.

Embodiment 15

The embodiment of one of the embodiments 11-14, wherein the second switch is configured to be closed when the load current is negative to conduct current from the negative power supply input of the linear power amplifier to the output of the second voltage offset voltage power supply.

Embodiment 16

The embodiment of one of the embodiments 11-15, wherein the first voltage offset power supply and the second voltage offset power supply are connected in series with the tracking power supply output.

Embodiment 17

The embodiment of one of the embodiments 11-16, wherein the first voltage offset power supply and the second voltage offset power supply are constant voltage sources having similar outputs.

Embodiment 18

The embodiment of one of the embodiments 11-17, further comprising a first decoupling capacitor coupled between the positive voltage rail and ground, and a second decoupling capacitor coupled between the negative voltage rail and the ground.

Embodiment 19

The embodiment of embodiment 18, wherein the first decoupling capacitor is coupled between the first switch and the positive power supply input of the linear power amplifier.

Embodiment 20

The embodiment of one of the embodiments 18 or 19, wherein the second decoupling capacitor is coupled between the second switch and the negative power supply input of the linear power amplifier.

Embodiment 21

A method comprising: coupling a tracking power supply to a positive voltage rail and a negative voltage rail. The tracking power supply can be configured to generate a tracking power supply output similar to a linear power amplifier output. The method also comprises coupling a first voltage offset power supply to the tracking power supply output and the positive voltage rail. The method further comprises coupling a second voltage offset power supply to the tracking power supply output and the negative voltage rail. Also, the method comprises coupling a first diode to an output of the first voltage offset power supply and to a positive power supply input of the linear power amplifier. Further, the method comprises coupling a second diode to an output of the second voltage offset voltage power supply and to a negative power supply input of the linear power amplifier. Additionally, the method comprises configuring the linear power amplifier to couple to a load.

Embodiment 22

The embodiment of embodiment 21, wherein the first diode is configured to conduct current from the output of the first voltage offset power supply to the positive power supply input of the linear power amplifier.

Embodiment 23

The embodiment of one of the embodiments 21-22, wherein the second diode is configured to conduct current from the negative power supply input of the linear power amplifier to the output of the second voltage offset voltage power supply.

Embodiment 24

The embodiment of one of the embodiments 21-23, the method further comprising: coupling a first decoupling capacitor between the positive voltage rail and ground, and coupling a second decoupling capacitor between the negative voltage rail and the ground.

What is claimed is:

1. An apparatus, comprising:
    a tracking power supply configured to generate a tracking power supply output similar to a linear power amplifier output, wherein the tracking power supply is coupled to a positive voltage rail and a negative voltage rail;
    a first voltage offset power supply coupled to the tracking power supply output and the positive voltage rail;
    a second voltage offset power supply coupled to the tracking power supply output and the negative voltage rail;
    a first diode coupled to an output of the first voltage offset power supply and coupled to a positive power supply input of the linear power amplifier;
    a second diode coupled to an output of the second voltage offset voltage power supply and coupled to a negative power supply input of the linear power amplifier; and
    an output of the linear power amplifier coupled to a load.

2. The apparatus of claim 1, wherein the first diode is configured to conduct current from the output of the first voltage offset power supply to the positive power supply input of the linear power amplifier.

3. The apparatus of claim 1, wherein the second diode is configured to conduct current from the negative power supply input of the linear power amplifier to the output of the second voltage offset voltage power supply.

4. The apparatus of claim 1, wherein the first voltage offset power supply and the second voltage offset power supply are connected in series with the tracking power supply output.

5. The apparatus of claim 1, wherein the first voltage offset power supply and the second voltage offset power supply are constant voltage sources having similar outputs.

6. The apparatus of claim 1, further comprising a first decoupling capacitor coupled between the positive voltage rail and ground, and a second decoupling capacitor coupled between the negative voltage rail and the ground.

7. The apparatus of claim 6, wherein the first decoupling capacitor is coupled between the first diode and the positive power supply input of the linear power amplifier.

8. The apparatus of claim 6, wherein the second decoupling capacitor is coupled between the second diode and the negative power supply input of the linear power amplifier.

9. An apparatus, comprising:
- a tracking power supply that generates a tracking power supply output similar to a linear power amplifier output, wherein the tracking power supply is coupled to a positive voltage rail and a negative voltage rail;
- a first voltage offset power supply coupled to the tracking power supply output and the positive voltage rail;
- a second voltage offset power supply coupled to the tracking power supply output and the negative voltage rail;
- a first switch coupled to an output of the first voltage offset power supply and coupled to a positive power supply input of the linear power amplifier;
- a second switch coupled to an output of the second voltage offset voltage power supply and coupled to a negative power supply input of the linear power amplifier; and
- an output of the linear power amplifier coupled to a load having a load current.

10. The apparatus of claim 9, wherein the first switch is configured to be closed when the load current is positive to conduct current from the output of the first voltage offset power supply to the positive power supply input of the linear power amplifier.

11. The apparatus of claim 9, wherein the second switch is configured to be closed when the load current is negative to conduct current from the negative power supply input of the linear power amplifier to the output of the second voltage offset voltage power supply.

12. The apparatus of claim 9, wherein the first voltage offset power supply and the second voltage offset power supply are connected in series with the tracking power supply output.

13. The apparatus of claim 9, wherein the first voltage offset power supply and the second voltage offset power supply are constant voltage sources having similar outputs.

14. The apparatus of claim 9, further comprising a first decoupling capacitor coupled between the positive voltage rail and ground, and a second decoupling capacitor coupled between the negative voltage rail and the ground.

15. The apparatus of claim 14, wherein the first decoupling capacitor is coupled between the first switch and the positive power supply input of the linear power amplifier.

16. The apparatus of claim 14, wherein the second decoupling capacitor is coupled between the second switch and the negative power supply input of the linear power amplifier.

17. A method comprising:
- coupling a tracking power supply to a positive voltage rail and a negative voltage rail, wherein the tracking power supply is configured to generate a tracking power supply output similar to a linear power amplifier output;
- coupling a first voltage offset power supply to the tracking power supply output and the positive voltage rail;
- coupling a second voltage offset power supply to the tracking power supply output and the negative voltage rail;
- coupling a first diode to an output of the first voltage offset power supply and to a positive power supply input of the linear power amplifier;
- coupling a second diode to an output of the second voltage offset voltage power supply and to a negative power supply input of the linear power amplifier; and
- configuring the linear power amplifier to couple to a load.

18. The method of claim 17, wherein the first diode is configured to conduct current from the output of the first voltage offset power supply to the positive power supply input of the linear power amplifier.

19. The method of claim 17, wherein the second diode is configured to conduct current from the negative power supply input of the linear power amplifier to the output of the second voltage offset voltage power supply.

20. The method of claim 17, further comprising:
- coupling a first decoupling capacitor between the positive voltage rail and ground, and
- coupling a second decoupling capacitor between the negative voltage rail and the ground.

* * * * *